(12) United States Patent  (10) Patent No.: US 8,226,880 B2
Pricone  (45) Date of Patent: Jul. 24, 2012

(54) PROCESS FOR FABRICATING PRECISE MICROSTRUCTURES

(75) Inventor: Robert M. Pricone, Libertyville, IL (US)

(73) Assignee: 10X Technology, LLC, Libertyville, IL (US)

( * ) Notice: Subject to any disclaimer, the term of this patent is extended or adjusted under 35 U.S.C. 154(b) by 1012 days.

(21) Appl. No.: 12/119,296

(22) Filed: May 12, 2008

(65) Prior Publication Data

US 2008/0251964 A1    Oct. 16, 2008

Related U.S. Application Data

(63) Continuation-in-part of application No. 10/883,869, filed on Jul. 2, 2004, now abandoned.

(60) Provisional application No. 60/485,268, filed on Jul. 7, 2003.

(51) Int. Cl.
  *B32B 37/04* (2006.01)
  *B32B 27/08* (2006.01)
(52) U.S. Cl. ........................ 264/446; 264/167
(58) Field of Classification Search .............. 264/446
  See application file for complete search history.

(56) References Cited

U.S. PATENT DOCUMENTS

| | | |
|---|---|---|
| 3,359,671 A | 12/1967 | Erich-Arthur Nier et al. |
| 3,689,346 A | 9/1972 | Rowland |
| RE28,068 E | 7/1974 | Lemelson |
| 3,935,359 A | 1/1976 | Rowland |
| 4,104,416 A | 8/1978 | Parthasarathy et al. |
| 4,205,028 A | 5/1980 | Brueggemann et al. |
| 4,349,601 A | 9/1982 | Brueggemann et al. |
| 4,472,451 A | 9/1984 | Mulder |
| 4,478,769 A | 10/1984 | Pricone et al. |
| 4,486,363 A | 12/1984 | Pricone et al. |
| 4,519,884 A | 5/1985 | Ritchie |
| 4,601,861 A | 7/1986 | Pricone et al. |
| 4,711,833 A | 12/1987 | McAneney et al. |
| 5,304,332 A | 4/1994 | Richart |
| 5,468,542 A | 11/1995 | Crouch |
| 5,512,219 A | 4/1996 | Rowland et al. |
| 5,565,151 A | 10/1996 | Nilsen |
| 5,614,286 A | 3/1997 | Bacon, Jr. et al. |
| 5,657,162 A | 8/1997 | Nilsen et al. |
| 5,706,132 A | 1/1998 | Nestegard et al. |

(Continued)

FOREIGN PATENT DOCUMENTS

DE    2 140 299    8/1973

(Continued)

OTHER PUBLICATIONS

Harper, C., Modem Plastics Handbook, 2000, McGraw-Hill/McGraw-Hill Companies, Inc., pp. C.28, C.29, C.44 and C.45.

*Primary Examiner* — Christina Johnson
*Assistant Examiner* — Patrick Butler
(74) *Attorney, Agent, or Firm* — McDonnell Boehnen Hulbert & Berghoff LLP

(57) ABSTRACT

There is disclosed a method and apparatus for producing a polymeric film that accurately replicates a mold surface at least a portion of which surface has a complex pattern of microstructured or nano-structured dimensions. A polymeric powder is electrodeposited on an underlying mold surface and heated to its molten state to replicate a pattern on the mold surface. Then the powder can be cured to create a polymeric film. Finally the film is removed from the mold surface.

12 Claims, 10 Drawing Sheets

U.S. PATENT DOCUMENTS

| | | |
|---|---|---|
| 5,763,049 A | 6/1998 | Frey et al. |
| 5,885,490 A | 3/1999 | Kawaguchi et al. |
| 5,971,732 A | 10/1999 | Grisch et al. |
| 6,004,422 A | 12/1999 | Janovec et al. |
| 6,010,609 A | 1/2000 | Mimura et al. |
| 6,086,813 A | 7/2000 | Gruenwald |
| 6,120,280 A | 9/2000 | Mimura et al. |
| 6,235,228 B1 | 5/2001 | Nicholl et al. |
| 6,486,226 B2 | 11/2002 | Al-Akhdar et al. |
| 6,524,517 B1 | 2/2003 | John et al. |
| 6,537,671 B2 | 3/2003 | Muthiah |
| 6,592,967 B2 | 7/2003 | Kaufman |
| 6,899,838 B2 | 5/2005 | Lastovich |
| 2001/0040097 A1 | 11/2001 | Arao et al. |
| 2003/0102591 A1 | 6/2003 | Thielman et al. |
| 2003/0232174 A1 | 12/2003 | Chang et al. |
| 2004/0069637 A1 | 4/2004 | Eswarakrishnan et al. |

FOREIGN PATENT DOCUMENTS

| | | |
|---|---|---|
| DE | 100 45 955 A1 | 4/2002 |
| GB | 1 327 586 | 8/1973 |

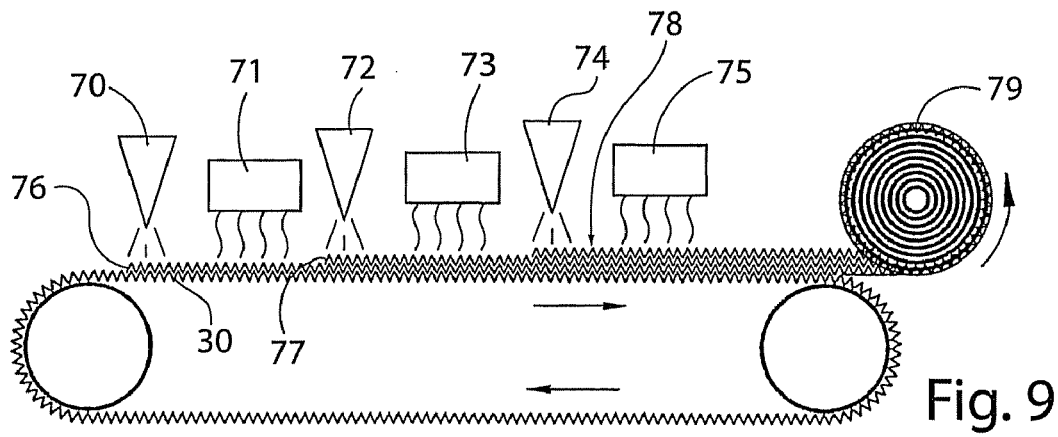
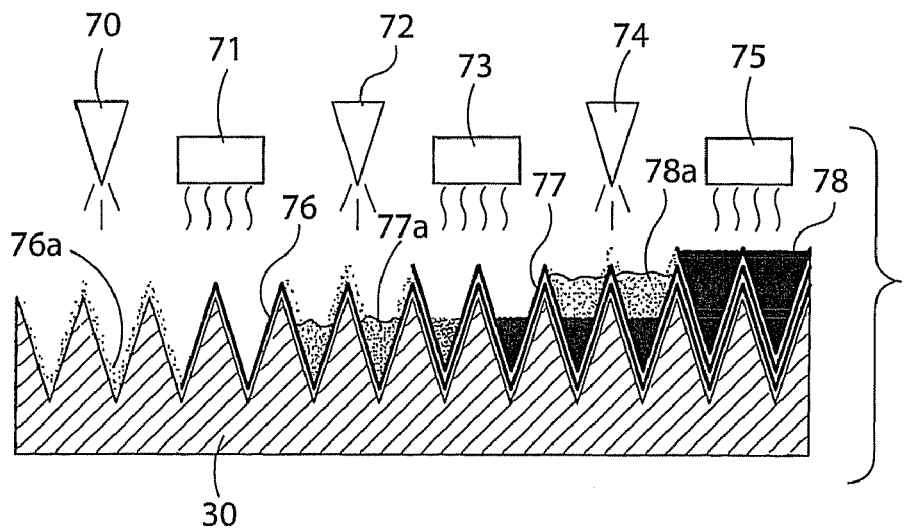
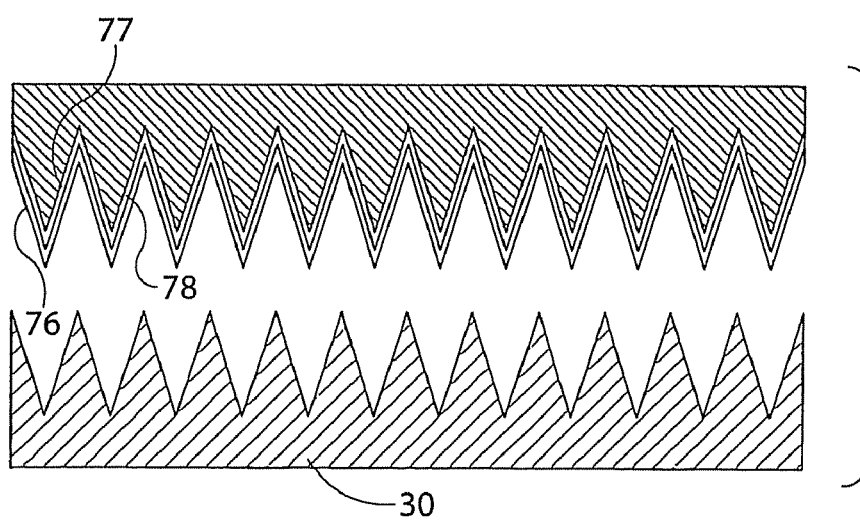

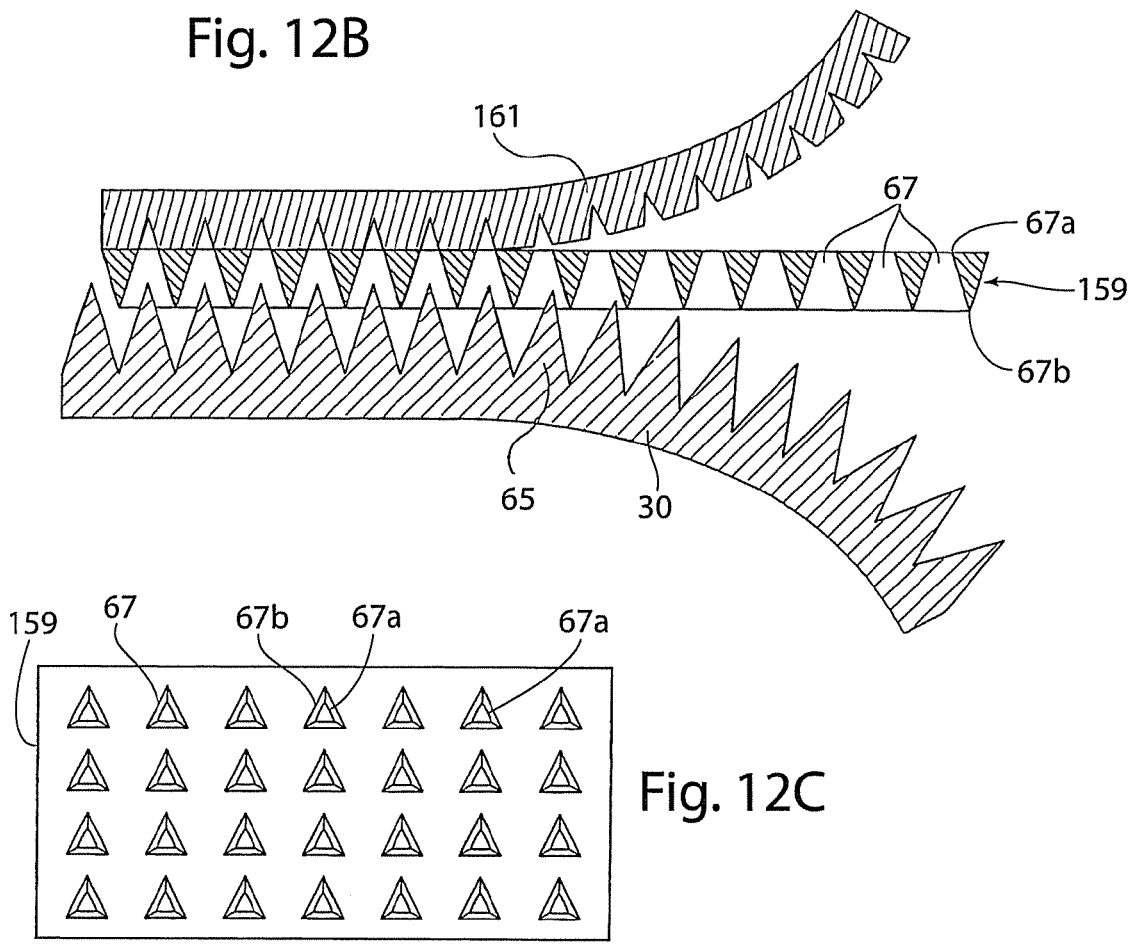
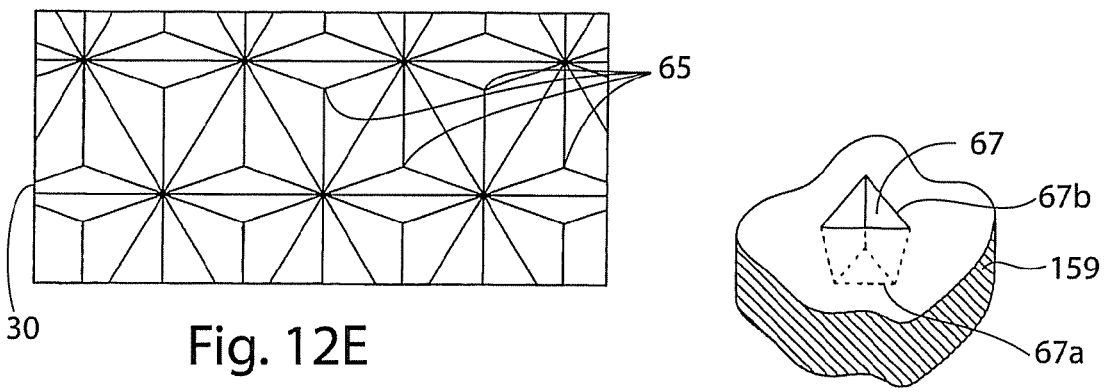

PROCESS FOR FABRICATING PRECISE MICROSTRUCTURES

This application is a continuation-in-part and claims the benefit of U.S. Ser. No. 10/883,869, filed Jul. 2, 2004, which claims the benefit of U.S. provisional patent application Ser. No. 60/485,268, filed Jul. 7, 2003, entitled "A Process And Apparatus for Fabricating Precise Microstructures And Polymeric Molds for Making Same."

BACKGROUND OF THE INVENTION

Fabrication of microstructured and nano-structured products known to be of interest in various industries include arrays of structured elements having optical applications, such as lenticular lenses, Fresnel lenses, light guides, diffusers, retro-reflective films, micro-lens arrays, brightness enhancement film (BEF) and LED arrays. Other applications include biomedical components, solar concentrators, micro-fluidic products, tissue culture media, micro-electrical-mechanical devices (MEMS), micro-acoustical devices, Chemical Mechanical Planerization (CMP), fuel cells, and other geometries that benefit from high speed, precision, microfabrication technology that provides high volume commercialization at economical cost.

The present invention has novel advantages because mold cost and fabrication time is reduced, which translates to faster scale-up and commercialization but also benefits from higher manufacturing speed than the prior art. The invention also allows the use of a wider range of materials than the prior art, including both thermoplastic and thermoset polymers, optionally loaded with other second phase or filler materials such as, for example, ceramic, glass or metal powders. Such latitude in prior art processing does not exist or creates significant tool wear. The present invention provides the ability to microform materials that can withstand higher use temperatures or that become polymer composites, having improved mechanical, electrical or optical properties which are of significant benefit for some end use applications, beyond the narrow range of typically used polymers.

The present invention adapts several commercially known techniques not previously used in microfabrication to achieve novel results.

In accordance with the present invention, polymeric products can be made by electrodepositing powdered polymer by means of a variation of the process generally known as powder coating. This process, sometimes referred to as solventless or dry painting, does not require the use of any liquids and therefore eliminates the problems associated with air entrapment. According to one aspect of the invention, powder is applied to the structured mold from the bottom up, eliminating the possibility of air being trapped and speed is only limited by the melt time and cure rate of the polymer.

The powder coating industry is well known for coating metal substrates. Recently, significant innovations have reduced both the cure temperature and cure time, thereby allowing temperature-sensitive substrates such as wood and PVC to be coated. Three of the major industry innovators are Rohm and Haas Powder Coatings, PPG Powder Coatings, and DuPont Powder Coatings. Some of the typical polymers used for the powder coating process are acrylics, generally recommended for extreme weather-resistance, epoxy resins for pipe and office furniture, epoxy-polyesters for light fixtures and shelving, polyesters for paneling, automotive components and garden furniture, and silicones for high-temperature applications such as barbecue grills.

Application equipment to dispense the powder is quite sophisticated. Complete systems from companies such as ITW-Gema and Wagner provide complete automated systems that apply powder electrostatically to coat parts on a conveyer-line and then cure the coated parts. Of specific interest is equipment which has been designed for continuous webs such as for coil coating. Powder is applied to moving steel coils at relatively high speed (20-30 ft min.) and thickness of 50-200 microns (0.002"-0.008") then cured and wound up into rolls. This equipment is substantially similar to what would be required to make continuous rolls of microstructured film as described in this application.

Conventional powder coatings are heat cured at temperatures that range from 300° F. and higher. These are useful for fabrication processes that use metal molds or high melt temperature polymeric molds, but in some cases there are advantages to using polymeric molds that have lower temperature stability. For fabrication processes that use low temperature polymeric molds, low temperature powder coatings are of value. Of particular interest are some of the recently developed UV powder coatings, which can cure in 1-5 seconds at temperatures as low as 125-175° F. Low temperature curing powder coatings are also of value when combining different layers of polymers to achieve products that have specific physical, chemical or optical properties.

Powder particle sizes range from 5-20 microns in diameter but it is possible to achieve even smaller sizes. The ability to achieve small particle sizes is important to some aspects of this invention because in some applications, there is a need to replicate microstructures with high aspect-ratios or with very small functional features. In the case of a high aspect-ratio feature, such as a mold with a recessed microstructure only 10 microns wide and 50 microns deep (5:1 aspect ratio), the associated powder particles would have to be small enough to fill the recesses of the mold.

SUMMARY OF THE INVENTION

The present invention relates to a process and apparatus used to microfabricate complex patterns of precision microstructures, nano-structures and the methods of making polymer molds. Typically microstructures are considered to be in the range of 0.010 inches (250 microns) to 0.000393 inches (1 micron) and nano-structures to be below 0.00000393 inches (0.001 microns). For purposes of convenience only, the phrase microstructure as used herein also shall be deemed to include those small macrostructures requiring precision optical configurations that require precise dimensions, angles and surfaces, such as cube-corner reflectors; parabolic surfaces for LED's; dihedrals for light guides and other structures known to those skilled in the optics art. In some instances, the present invention also has great utility in forming complex patterns of precise optical configurations in relatively small macrostructures, in the range of 1 mm to 10 mm. Such microstructures and nano-structures also can include other structures of the same dimensions but having applications in fields other than optics.

A primary object of the invention is to provide a method and apparatus for creating a polymeric film that accurately replicates a complex mold surface at least a portion of which surface has microstructured or nano-structured dimensions.

Another object of the invention is to provide an article comprised of a layer of polymeric material at least a portion of which contains a surface area of a complex array of microstructure of optically precise dimensions.

Another object of the invention is to provide a process for forming molds that contain microstructured and nano-structured patterns by electrodeposition of one or more layers of thermoplastic or thermoset polymers (with and without incorporation of second phase materials).

Another object of the invention is to provide apparatus for continuously forming thermoplastic or thermoset precision microstructured products using either polymeric or metal molds.

Another object of the invention is to continuously form polymeric products having precision microstructures and nano structures.

Another object of the invention is to provide apparatus and a process to form precision microstructures in polymers with multiple hard or soft layers.

Another object of the invention is to provide polymeric molds and microstructured products from commercially available polymer layers rather than from custom formulated polymers.

Another object of the invention is to form polymeric precision microstructures with through-holes or vias.

In summary, there is provided a method of producing a polymeric film or other object that accurately replicates a complex mold surface at least a portion of which surface comprises features having microstructured or nano-structured dimensions, comprising the steps of:

(a) electrodepositing a polymeric powder on an underlying mold have such a complex surface;

(b) curing the powder to create a polymeric film or object; and (c) removing the polymer film or object having an inverse replica of the complex surface.

In further summary, there is provided an apparatus for continuously producing a web of polymeric film that accurately replicates a complex mold surface at least a portion of which surface comprises features having microstructured or nano-structured dimensions, comprising:

(a) means for electrodepositing a layer of polymeric powder onto an underlying mold having such a complex surface;

(b) means for effecting a cure of said powder to create a polymeric film; and (c) means for facilitating removal of the film from the mold, the film having an inverse replica of the complex surface.

In further summary, there is provided an article comprising a polymeric film or other object, a portion of the surface area thereof comprising a complex array of microstructures of optically precise dimensions, and wherein said article is formed by curing a powder which has been electrodeposited against such a complex mold surface defining the shape of at least a portion of the article.

An important advantage of the invention is the ability to make polymeric molds as part of the apparatus to form precision microstructures. Since many of these powdered polymers and particularly the UV cure version can be deposited and polymerized into a mold at low cure temperatures, a polymeric mold becomes a faster and less expensive alternative to metal molds described in the prior art.

Such a polymer mold has multiple cost and process advantages. By fabricating a polymeric mold consisting of high glass transition polymer or thermosetting polymer, it is possible to replicate lower glass transition polymers using the process described in U.S. Pat. No. 4,486,363 or any improved versions of hot polymer embossing without the cost or time required to build large cylindrical metal molds.

Apparatus and methods are disclosed for fabricating a polymeric mold by electrostatically applying a powdered polymer layer on to a master microstructured pattern. Master patterns can be made by a number of recognized methods such as diamond turning, ruling, deep reactive ion etching (DRIE) or other techniques that provide such patterns. The master pattern or an electroformed copy of the master pattern can be used to make polymeric copies quickly and inexpensively that can be assembled by tiling methods known in various industries. This assembly of parts into a larger mold can be used in conjunction with further disclosed assembly apparatus such as die cutting and precision positioning equipment to provide larger molds for use in fabricating microstructured products.

It has also been demonstrated that pieces of a polymer film mold can be adhered to a stronger backing such as stainless steel or other suitable substrates that would give the composite additional strength and durability as well as electrostatic conductivity.

Another method to make a polymeric mold would be to provide a small and inexpensive electroformed mandrel to fabricate a polymer mold of any length or even continuous rolls of such molds by the use of a scaled down version of the apparatus described in U.S. Pat. Nos. 4,486,363 or 4,601,861.

Yet another method to make a polymeric mold would be to first fashion a small mold having a pattern of microstructures as a small continuous belt, then apply a polymer layer continuously that will provide replication of the small mold to provide a mold of any required length having the microstructures thereon.

One of the primary advantages of this technique is that the master pattern or mold fills from the bottom up as the powder is deposited. Making polymeric molds by embossing as defined in U.S. Pat. Nos. 4,486,363 and 4,601,861 requires the viscous polymer to be pushed down from the top, trapping air during the process; embossing also is limited to thermoplastic polymers. In accordance with the present invention, small particle size and, in particular, sub-micron and nano-scale particles have advantages in filling sub-micron and nano-scale complex features, while avoiding the viscosity and surface tension limitations of hot-polymer or liquid replication found in embossing or casting techniques which may require pushing the polymaterial into the mold cavities.

Another primary advantage of the present invention is that the polymer layers can be made from thermoset or UV curable polymers which have much higher service temperature and dimensional stability.

Using any of the above methods to provide a polymeric mold, powdered polymers available from various industry sources can be used to make either individually replicated parts with microstructured patterns or continuously fabricated film wound into rolls.

The present invention is a significant enhancement of the typical formation of conventional powder coating materials, wherein thermoplastic or thermosetting polymers are ground to fine particles sizes and combined with pigments to provide color, and other additives specifically designed to ensure adhesion as a coating to a variety of different substrates. The present invention allows for the elimination of pigments and adhesion promoters thus permitting conventional powder coating apparatus to electro-deposit pure powdered polymers on to molds, where they then can be cured in place and then removed as a continuous film.

Commercially available or custom formulated powdered polymers can be selected based on the final product requirements for physical properties, chemical resistance, weatherability, service temperature, refractive index, and light transmission, among others.

The simplest form of this invention would be to use a powder version of the acrylic or polycarbonate polymers used in the prior art (U.S. Pat. Nos. 4,486,363 and 4,601,861), then electrostatically apply the powder into a coupled mold, cure the layer with the replicated pattern now locked in the polymer, and remove the coupled layer from the mold. Since the need for these two polymers has been well established in the field of optical and other light management microstructures, they would be among the preferred embodiments of this invention.

In conjunction with the novel method of making a polymeric mold, one of the primary advantages of this technique for fabricating microstructured products is that the mold fills from the bottom up as the powder is deposited. The prior art requires the polymer to be melted and the high viscosity liquid pushed down from the top, thereby trapping air during the process and making it more difficult to achieve the levels of precision required in smaller micro and nano-structured precise patterns.

Another primary advantage of using a powder layer to fill the mold is that for applications in which the microstructure features represent a minority cross-section of the entire product, the microstructure can be quickly filled and then laminated to a thicker backing, thus eliminating the need to melt and form the entire substrate. An example of this is Brightness Enhancing Film (BEF) known in the industry to improve the brightness efficiency of notebook computer screens. This film typically is 0.006 inch (150 microns) thick with a microstructure having a cross section of typically 0.005 inch (125 microns). In accordance with the present invention, the need to melt and reform 0.006 inch (150 microns) polycarbonate is unnecessary if the features are replicated with powdered polymer, cured and then laminated to the polycarbonate backing.

Another primary advantage is the speed of application and cure speed compared to prior art. Typical industry speeds for powder coating and especially continuous powder coating such as for coil coating steel sheet can be 20-30 feet per minute (6-9 meters) at width up to 8-10 feet (2.4-3 meters).

An additional advantage is that different powder formulas can be applied in layers. If a hard outer surface of the microstructure is required the first thickness of powder could be nylon or other sufficiently hard materials, followed by as many different layers as required. During the cure phase they will all fuse together forming gradients of hardness. The fused multilayer film with the microstructured pattern now locked in is then removed from the mold. This layering technique is particularly useful for fabricating micro-needles which must be hard enough at the tip to puncture skin but resilient enough at the base not to shear-off under stress. The same process can be used to achieve other physical properties, such as modulus or resiliency, linear expansion coefficients and tailored chemical properties such as resistance to acid, caustic, moisture barrier properties or resistance to solvent-base chemicals.

Yet another advantage is a means to produce precision through-holes in polymers, or micro-vias, by partially filling a mold leaving the top of the microstructures uncovered. The use of a soft polymeric backing-film can insure removal of any powder on the tips of the mold and a planer surface on the packed powder. Once cured, the polymer can be removed leaving a precision structured through-hole or via formed by the projected microstructure in the mold. An additional advantage of this method allows the holes to be made in a variety of shapes, such as a circle, triangle, square, etc and tapered to any degree, as determined by the mold structure.

Still another advantage of this invention is that microstructures can be formed onto rigid substrates. Once the mold is filled with the powdered polymer, it can be laminated to a rigid polymeric sheet and then cured; thereby fusing the microstructured pattern to a much thicker support member. An example of this advantage can be demonstrated by laminating and then fusing clear, polymeric micro-prisms to a thick sheet of rigid clear backing. Typical ranges for the microstructures could be 64 micron tall micro-prisms (0.0025 inch) fused to 0.375 inch rigid sheet. The resulting combination would provide a retro-reflective, micro-prismatic product rigid enough to be a ready made road sign. Normally, micro-prismatic retro-reflective sheeting as described in U.S. Pat. Nos. 4,486,363 and 4,601,861 must be manufactured with adhesive backing and then later applied to a treated aluminum panel that provides a rigid support member. The described novel approach attaches the micro-prisms directly to a polymeric support member such as polycarbonate or another clear impact resistant polymer; eliminating the adhesive and fabrication operations, significantly reducing cost and fabrication time.

Another advantage of this invention is to use polymer powder directly from the polymerizing process, bypassing the need to form pellets and extrude film. This is of particular advantage for polymers such as polycarbonate which are first generated as powder, then formed into pellets and finally extruded into film. In the case where some polymers are not normally produced as powder, it still may be an advantage to grind the polymer into powder, rather than extrude pellet into film and then try to replicate a pattern of microstructures on the film.

Another advantage of using powder directly from the reactor is the absence of additives that are necessary for the extrusion or injection molding processes; the absence of such additivies can lead to improved optical properties such as bulk absorbtivity and light transmission.

BRIEF DESCRIPTION OF THE DRAWINGS

While the drawings depict preferred embodiments of the present invention, they are by way of example only and are not intended to limit the scope of the invention. It is expected that variations and further modifications as well as further applications of the principles of the invention will occur to others skilled in the art and while differing from the foregoing, remain within the spirit and scope of the invention as described.

FIG. 9 is a schematic view of an apparatus to make continuous microstructured product that comprises multiple polymeric layers;

FIG. 10 is an enlarged view of the different polymeric layers in FIG. 9;

FIG. 11 is an enlarged view of the cured layers from FIG. 9 fused together and separated from the underlying mold surface;

FIG. 12B is an edge view of the bottom mold layer and top polymer layer of FIG. 12 being peeled away revealing the fabricated polymer film with precision through-holes;

FIG. 12C is a bottom plan view of the film with through-holes as formed by the apparatus in FIGS. 12, 12A, and 12B;

FIG. 12D is a magnified view of an individual through-hole in FIG. 12C;

FIG. 12E is an enlarged top plan view of a mold that can be used in the method and apparatus of FIGS. 12, 12A, and 12B.

DETAILED DESCRIPTION

In the following detailed description, the invention will be described in relation to the production of films having a pattern of microstructures replicated on at least a portion of a surface thereof. It is to be understood, however, that the invention is not so limited, and objects other than films also can be produced in accordance with the invention to have such a replicated pattern of microstructure on a surface thereof.

As used herein, a "complex" pattern of microstructures or nano-structures shall mean a pre-determined pattern of micro-structures or nano-structures intended to serve a function, as compared to haphazard patterns of structures that might arise from natural processes. Examples of complex patterns of structures within the meaning of the present invention include, without limitation, patterns for the retroreflection of light, patterns for brightness enhancement films, patterns for the introduction of medicaments through the skin of an individual such as by means of a patch, patterns for Fresnel lenses, solar collectors and the like.

Figure 1:
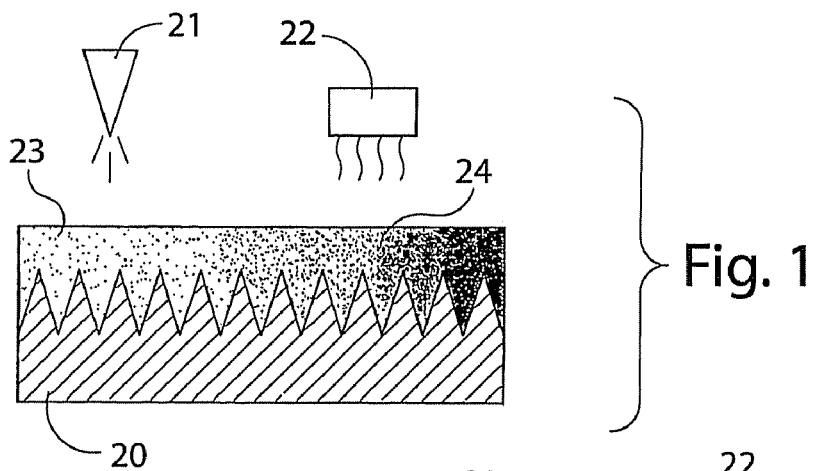
FIG. 1 is a schematic edge view of a mold, with a powdered polymer being applied and melted, providing a film having the inverse pattern of the mold accurately replicated on the film surface.

Referring to FIG. 1, a method to replicate polymeric mold sections is shown including a master-mold 20 made of electrodeposited nickel having a representative pattern of lenticular microstructures on the surface. Metal master-molds or tools are expensive, precision micro-machined original patterns, such as described, for example, in U.S. Pat. No. 4,478,769. The novel polymeric replications of the present invention provide a faster, less expensive method of fabricating larger master-mold arrays.

In the apparatus of FIG. 1, the polymer prowder can be either a thermoplastic resin which melts and then cools to form a solid film, or a non-UV curable thermoset resin which melts, cross-links while in the molten state, and then cools to form a thermoset solid film. In one embodiment of the invention, an electrostatic powder application 21 such as Wagner's Corona PEM-C3 Manual Spray Gun is used to apply a 0.004" layer of a non-UV curable thermoset resin such as epoxy based 445-100-1 CORVEL® GREEN powder 3 from Rohm and Haas Powder Coatings, with a particle size of 10 microns. A source of infra red radiation 22 such as an electric or gas IR emitter is applied for sufficient time and at a sufficient temperature to cause the polymer powder to melt and flow. For this epoxy a time of two minutes and a temperature of 350° F. (176° C.) were used. The molten polymer is then allowed to cool to form a polymer film 24. If the polymer is a non-UV curable thermoset, it will cure during the cooling step. The mold 20 may be metal or a polymeric replica as long as it is dimensionally stable at the melt and cure temperatures required for the polymers being applied. One of the primary advantages of using powder to form the polymeric layer over the mold is that it fills the pattern from the bottom up as the powder is being deposited, eliminating air entrapment, one of the problems common to prior art embossing or casting techniques.

Normally, substrates that are powder coated are surface treated with an adhesion promoting chemical bath prior to application of the powder to assure adhesion of the powder coating. In this case, however, since the objective is to melt, optionally cure and then remove the polymer as a film with the pattern replicated on a surface of the film 24, the surface treatment of the mold 20 was omitted prior to application of the powder. In addition, since most powder coating products are formulated with adhesion promoting additives, each product has to be tested to insure it will separate from the mold. In some cases, adhesion promoting additives may be intentionally omitted from a powder formulation if they are found to interfere with the removal process.

The non-UV curable epoxy based 445-100-1 CORVEL® worked well, but the process is not limited to this product. Many other thermoplastics or thermoset powdered polymers 23 commercially available from suppliers such as Rohm and Haas Powder Coatings, PPG Powder Coatings, or DuPont Powder Coatings, are suitable for the process. The powder selection and size will depend on the end use of the finished product. The suitability of commercially available powder coatings for this application is based on several factors including chemical, physical and optical properties, melt point, and the ability to release from the mold substrate. Among the thermoplastics are polyesters, acrylics, urethanes, Nylons, polypropylenes, polyethylenes, polyvinylchlorides and silicones. Among the non-UV curable thermosets are epoxies and epoxy-polyester, formulations.

There is also an unexpected significant advantage for some microfabrication process in using powdered polymer which is produced in powder form directly from the polymerizing process, thus bypassing the step of extruding the powdered polymer as a film. This is of particular advantage for polymers such as polycarbonate which are normally made as a powder. In prior art process such powders had to be formed into pellets and then extruded into film, which was then re-melted and pressed into molds. Additionally, other commercially available extrusion grade thermoplastic resins, not normally used for powder coating, such as polycarbonates from GE Plastics or acrylics from AtoFina can be bought in pellet form and ground into powder for electrostatic application such as described in this application.

Figure 2:
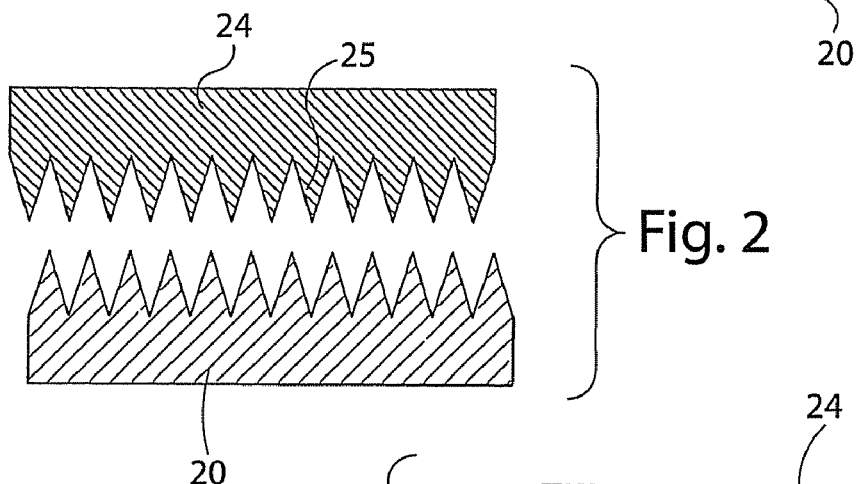
FIG. 2 is an edge view of the cooled polymer film of FIG. 1 being removed from the mold with the replicated, precision microstructure on the surface.

Referring to FIG. 2, the epoxy based 445-100-1 COR-VEL® cured polymeric film 24 with the lenticular precision microstructured pattern 25 now replicated on the surface is easily removable from mold 20. The lenticular precision microstructured pattern 25 has been accurately formed on the surface. Moreover, the separated film itself can be used as a mold to make subsequent replications with lower melt point powders. In this case, the film 24 was 0.004 inches (100 microns) thick.

Microscopic examination of the removed polymer film 24 showed there was accurate replication of the lenticular pattern 25 in the polymer. The film 24 was flexible enough to handle, bend and itself be used as a mold.

Figure 1A:
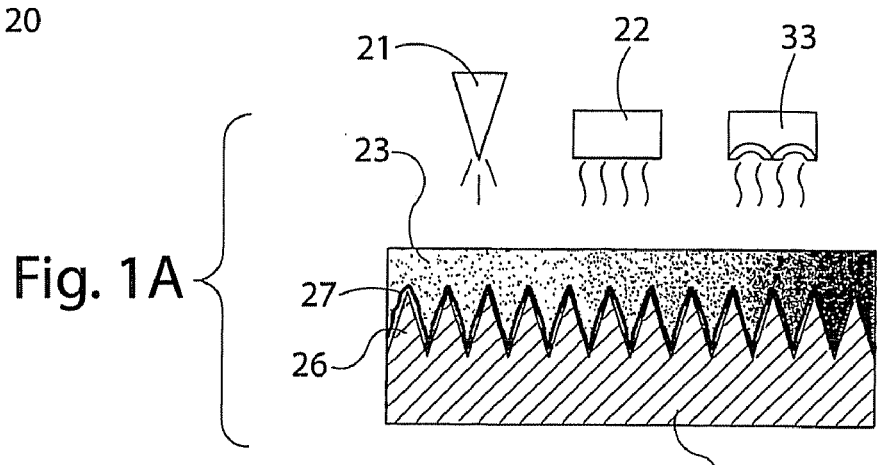
FIG. 1A is a schematic edge view of a mold, with a thermoset, UV curable powdered polymer being applied and melted and then cured, providing a film having the inverse pattern of the mold accurately replicated on the film surface.

FIG. 1A illustrates another embodiment of the invention adapted for use with UV-curable thermoset polymers. In the illustrated embodiment, the polymeric powder 23 was a clear UV curable product designated NX3-9067 Clear, also from Rohm and Haas Powder Coatings. In this case, because the melt temperature of the UV curable polymer 23 is only 175° F. (79° C.), the mold 20 was made from a polymer having a melting point higher than 175° F. (79°). The polymer mold 20 was made from Auto Haas DR101, an impact modified PMMA with a precision micro-prismatic structure 26 formed on the surface. Prior to application of the powdered polymer 23, the mold surface 20 was vapor deposited with a conductive aluminum layer 27 to help insure electrostatic charge through the powder coating application process. Again, in this illustrated embodiment the use of pretreatments that surface etch substrates to improve adhesion of the polymer, was avoided. The powdered polymer 23 was applied in a 0.0010" (250 microns) thick layer using a Wagner Corona PEM-C3 Manual Spray gun. The sample was heated with an IR emitter 22 to a temperature of 175° F. (79° C.) for two minutes to melt the polymer powder, then cured by UV radiation from a UV emitter 33 such as a 600 watt mercury lamp for two seconds.

The same conditions were also used for a metal substrate master made of nickel with a lenticular microstructure on the surface, the only difference being that the vacuum metallized layer was not needed since the metal substrate was already conductive.

Figure 2A:
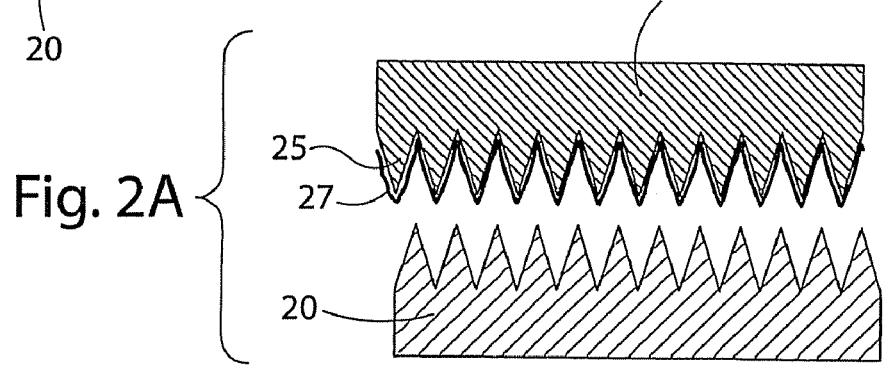
FIG. 2A is a view similar to FIG. 2 of a UV cured thermoset polymer film of FIG. 1A being removed from the mold with the replicated, precision microstructure on the surface.

Referring to FIG. 2A, the cured polymeric film 24 with the precision microstructure pattern 25 now replicated on a surface thereof was easily removed from mold 20 along with the metallized layer 27. Of particular importance is the replicated accuracy of the pattern 25 on the UV cured polymer film removed from the micro-structured, mold. Microstructures in the form of cube-cornered micro-prisms can function as precision retro-reflectors if formed within high dimensional tolerances. Typically, angle tolerances must be held with 2 minutes of arc or 99.9% of the required geometry, and surface flatness must be within 1000 Angstroms or 0.000003" in order to function properly. Examination of the micro-prismatic structures in the polymer film 24 removed from the mold demonstrated they were functional retro-reflectors and therefore dimensionally within the accuracy of these tolerances. Moreover, the separated film can be used to make subsequent replications.

Figure 3:
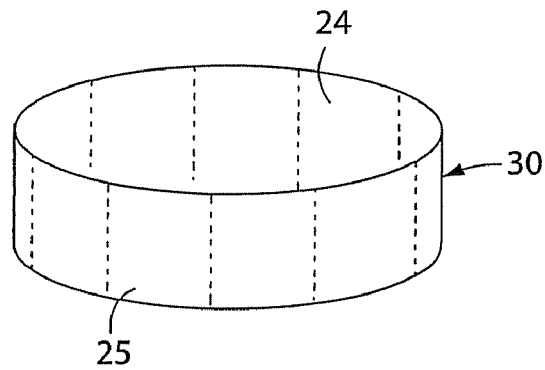
FIG. 3 is a perspective view of sections of the replicated polymer film assembled to make a thin flexible belt to be used as a continuous mold.

Referring to FIG. 3, a plurality of sections of cured polymeric film 24 with the microstructured pattern 25 formed thereon are cut and assembled to provide an endless, flexible belt 30 to be used as a mold.

Figure 4:
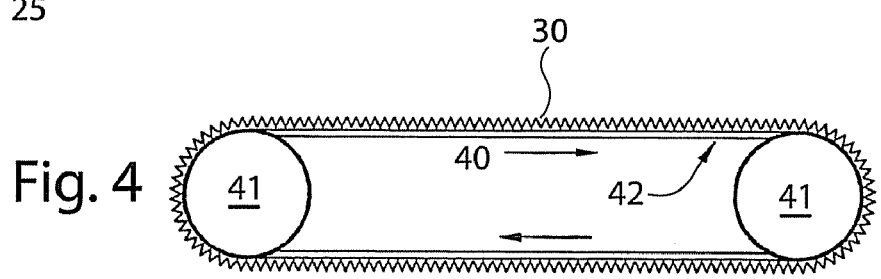
FIG. 4 is a side view of the assembled mold sections used as a flexible belt driven by rollers.

Referring to FIG. 4, the polymeric belt 30 in FIG. 3 is flexible enough to be used in the path 40 driven by two rollers 41. In one preferred embodiment the sections can be adhesively bonded to a strong metallic or polymeric backing such as stainless steel or Kapton® film 42 to improve strength and durability.

Other prior art equipment similar to the equipment described herein can be used to emboss thin film to be used as a mold, as disclosed in greater detail in U.S. Publication 20030232174 published Dec. 18, 2003, the subject matter of which is incorporated herein in full by reference.

Figure 5:
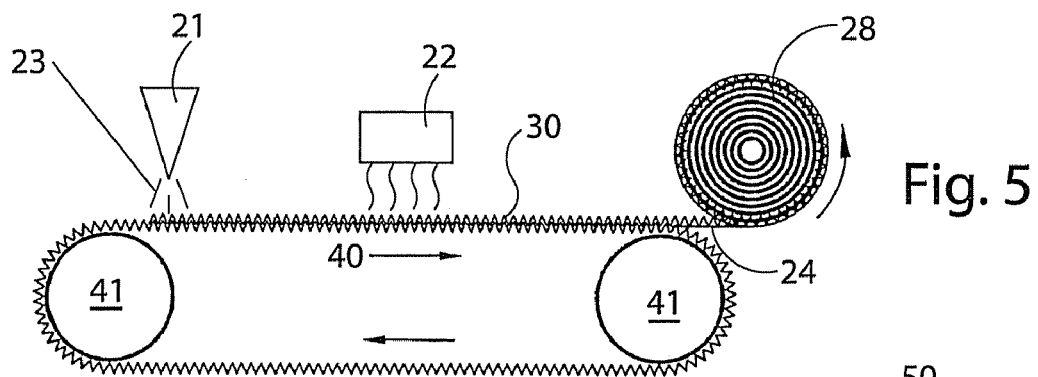
FIG. 5 is a schematic view of the apparatus to make long lengths of replicated polymeric layers to be used as a mold.

Referring to FIG. 5, another method to make a polymeric mold of much longer length for production apparatus that requires such a mold, is to first fabricate a much smaller mold, perhaps 12" (30.48 cm) in diameter or smaller, to be used as an endless belt 30, which is then replicated by having powdered polymer 23 applied from an applicator 21, melted and cured by using IR or UV radiation from a source 22. The cured film is then removed from the mold, and wound into rolls 28.

Figure 6:
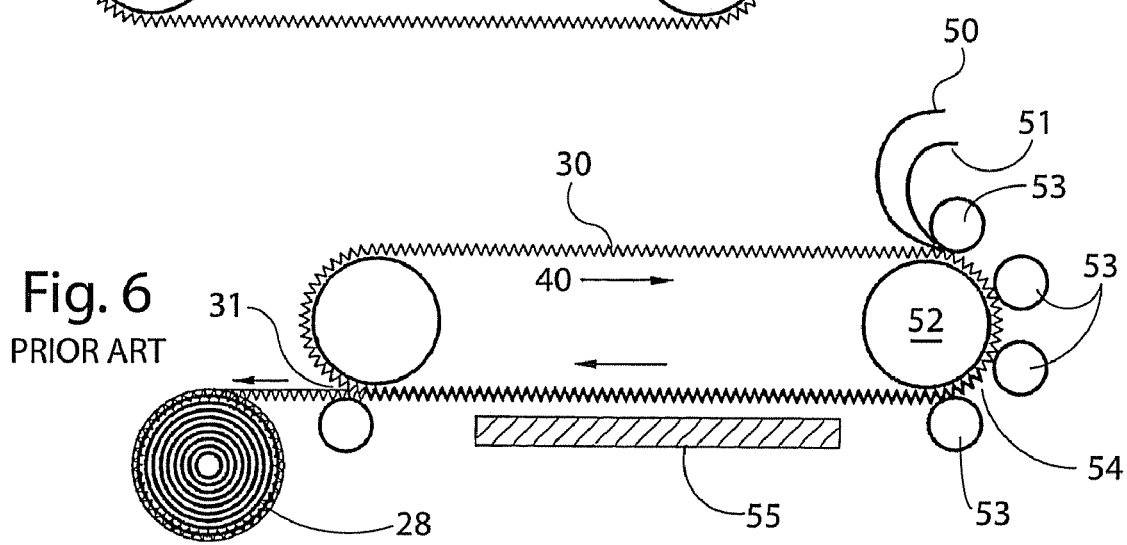
FIG. 6 is a schematic view of one form of prior art apparatus being used to make long lengths of a polymeric film.

Referencing FIG. 6, yet another method to make a polymeric mold of long length, is by adapting a miniature version of prior art embossing apparatus such as disclosed in U.S. Pat. Nos. 4,486,363 or 4,601,861 which can be used to make long lengths of microstructured polymeric molds for use with the apparatus disclosed in this application. Extruded polymeric film such as GE 0.006" (150 microns) polycarbonate 50 along with a higher melt point carrier film such as 0.002" (50 micron) PENN 51 is heated by hot roll 52 to a temperature of 425° F. (137° C.). A plurality (4 in FIG. 6) of pressure rolls 53 at 150 psi (10.5 bar), flow the polymer into the Fresnel pattern on the metal mold 30 in the path 40. The hot film 54 now with the mold pattern transferred to the surface is solidified by cooling station 55, removed from the mold at 31, then wound into rolls 28. The embossed film produced by this prior art technique can be used as the underlying mold surface in the powder technique of the present invention for polymer powders having melt and cure temperatures lower than the melting point of the embossed film.

Figure 7:
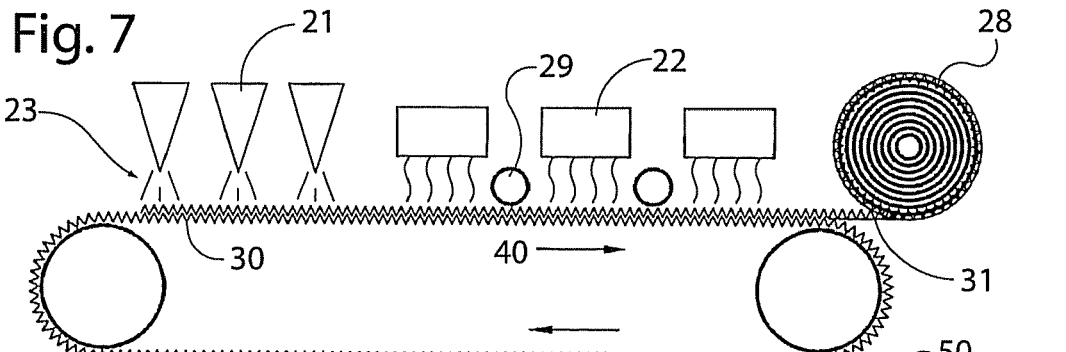
FIG. 7 is a schematic view of an apparatus to make a continuous microstructured product.

Referencing FIG. 7, one method to fabricate microstructured products at higher speeds than heretofore available involves use of a polymeric flexible belt mold 30 as illustrated in FIG. 5 or FIG. 6, of considerable length, used in path 40 of perhaps 100 feet or more. A mold of this size would allow the use of multiple powder application stations 21 (three shown in FIG. 7), to apply a layer of powdered polymer 23, and a plurality (three shown in FIG. 7) of IR or UV cure stations 22 to achieve speeds of 50 to 100 ft/min (16 to 33 meters min). A plurality of smoothing rolls 29 (two in FIG. 7) will speed the flow of molten polymer during the melt stage and prior to final cure. Finished product is then removed as a separate and flexible film 31, and then wound into rolls 28. Speed of the apparatus is limited only by the rate of powder application and time required for the IR emitters to melt and cure the polymer. UV curable polymer would further increase the cure speed and produce more product per hour with a similar length mold.

Figure 7A:
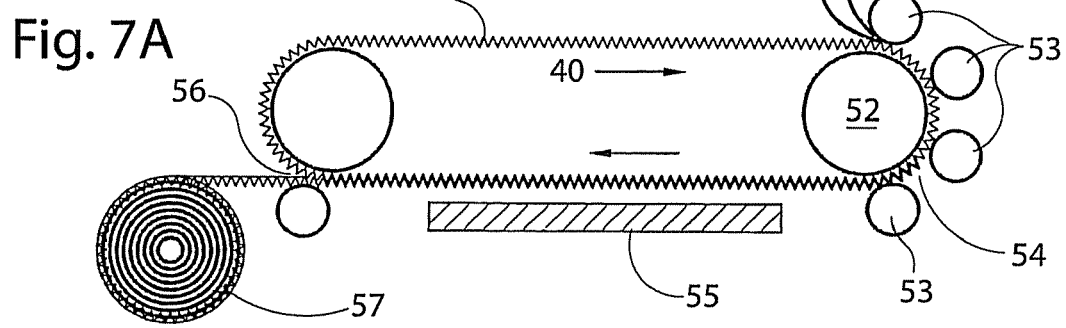
FIG. 7A is a schematic view of an alternative apparatus to make a continuous microstructured product.

FIG. 7A depicts an alternative method of fabricating precision microstructured product with apparatus substantially of the prior art but using polymeric molds as opposed to metal molds. The machine used was substantially similar to that described in U.S. Pat. Nos. 4,486,363 and 4,601,861 capable of operating at a temperature of 300° F. (149° C.), a pressure of 150 psi (10.4 bar) and a speed of 2 feet (61 cm) per min all parameters selected for the particular polymer used. The mold 30 was a flexible polymeric film moving through elliptical path 40, in place of the metal mold of the prior art. A Fresnel pattern on the surface of 0.0060 inch (150 micron) GE polycarbonate was used as the elliptical mold 30 to replicate the pattern on to 0.005 inch (125 micron) PVC film 50 available from Klocker as type PR-180-14. The polymeric mold 30 and the 0.005 inch (125 micron) PVC film to be replicated, along with a higher melt point carrier film 0.002 inch (50 micron) PENN 51 are all fed into the first of four pressure rollers 53. All three films (30,50 and 51) are heated by hot roll 52 while the pressure rolls 53 flow the molten PVC polymer into the pattern on elliptical mold 30. It should be noted that the 150° F. (66° C.) temperature is only hot enough to melt the film 50 and not the mold 30 or carrier film 51.

The hot film 54, now with the pattern transferred to the surface, is solidified again by cooling station 55. The PVC film 50 and PENN carrier film 51 are now removed together as film 56 from the mold 30, then wound into rolls 57.

Microscopic examination of the film 56 removed from the polymeric mold 30 showed good replication of the Fresnel grooves. Using the same machine and conditions, 0.006 inch (150 micron) polysulfone film was scribed with groove lines of 0.001 inch (25 microns) depth and used as a mold to replicate the pattern in Auto Haas DR101 impact modified PMMA. Microscopic examination demonstrated good replication of the groove pattern. As a result, it was determined that higher melt point polymer molds such as polycarbonate, polysulfone and others can be used as a mold to accurately form copies of lower melt point substrates such as PVC, acrylic and other lower melting point polymers.

Figure 8:
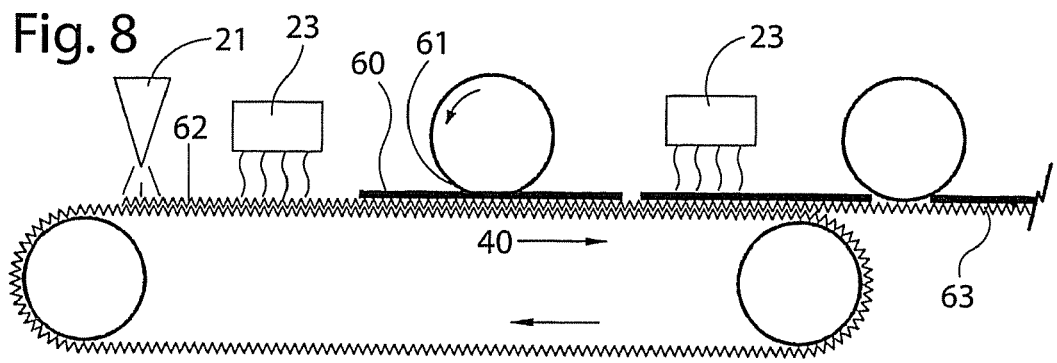
FIG. 8 is a schematic view of an apparatus to laminate thin layers of microstructured film to rigid substrates.

Referencing FIG. 8, rigid substrates such as 0.375 inch (9.5 mm) polycarbonate sheets 60 can be laminated at roller 61 to the molten microstructured film 62, which is preheated by a first IR station 22, and then cured after lamination by a second station 22. Cured polymer with the microstructured pattern formed therein then becomes an integral part of the finished composite 63. The composite can be separated into discrete objects by conventional means such as a die-cutter located downstream from second cure station 22. In one embodiment, the polycarbonate sheets can be blanks for highway or traffic signs and the film 62 can be a retroreflective film, so as to provide a rigid retroreflective sign.

Figure 8A:
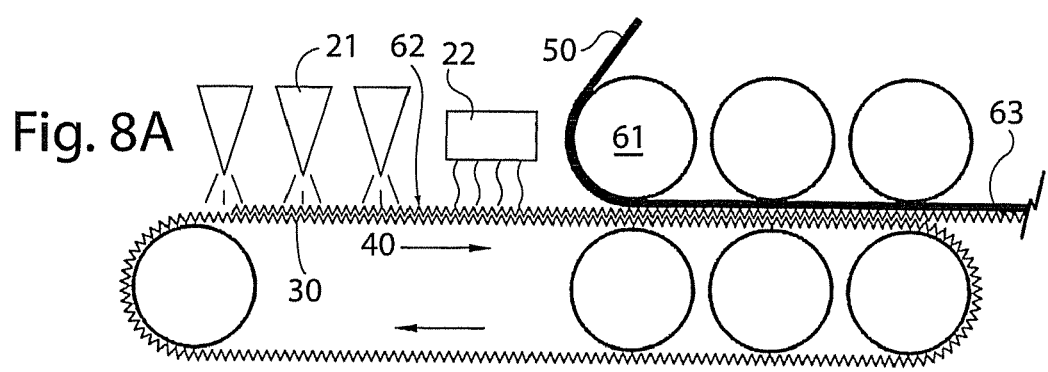
FIG. 8A is a schematic view of an apparatus to laminate thin layers of microstructured film to flexible substrates.

Referencing FIG. 8A, a flexible substrate 50 such as 0.006 inch (150 microns) polycarbonate 50 can be laminated at roller 61 to the molten microstructured film 62, which is preheated by IR station 22. Cured polymer with the microstructured pattern formed therein becomes an integral part of the finished composite 63, particularly if the powder 23 and the extruded flexible substrate are of the same polymer.

Referencing FIG. 9, a method to fabricate a continuous microstructured product comprising different polymer layers is achieved by using applicator gun 70 for the first layer 76, which is cured by IR heating station 71. Applicator gun 72 applies the second layer 77, cured by IR heating station 73. Applicator gun 74 applies the next layer 78 which is cured by IR heating station 75 and so on until all required layers are applied and cured. The final product is then removed from the mold 30 and wound into rolls 79.

FIG. 10 is an enlarged side view of the different polymer layers in FIG. 9. Applicator gun 70 applied the first layer of powder 76a onto mold 30. The particles of first powder 76a are somewhat large in relation to the microstructures formed on mold 30, and therefore the particles coat the entire surface of each of the microstructures. The first layer of powder 76a is melted and cured by IR or UV at station 71 to form thin film layer 76. The second layer of powder 77a is applied by applicator gun 72 and then melted and cured by IR or UV station 73 to form film layer 77. The particles of the second layer can be somewhat smaller than the particles of the first layer, such that these particles both coat the microstructures and fill in the recesses from the bottom up. The third layer of powder 78a is applied by gun 75 and then melted and cured by IR or UV station 75 to form film layer 78. The particles of powder 78a complete the filling of the recesses of the microstructures and extend over the tops of all the recesses.

Referencing FIG. 11, the layers 76, 77, and 78 have been fused together and are removed as one film from mold 30.

Figure 12:
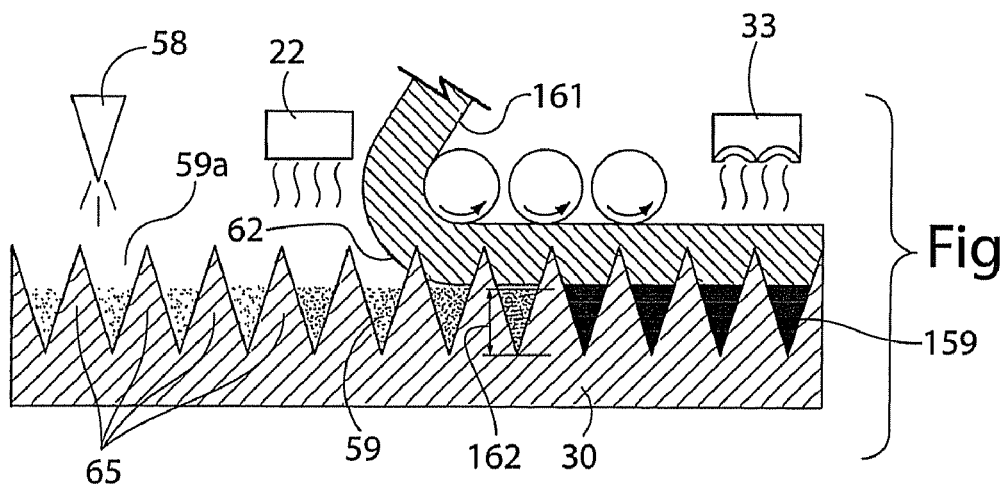
FIG. 12 is a schematic view of an apparatus to make continuous microstructured product with precision through-holes or vias.

FIG. 12 illustrates one preferred method to make precision microstructures with through-holes or vias. A layer of powdered polymer 59a is applied onto a mold 30 having mold protuberances 65 by gun 58, the particles of polymer 59a are small relative to the recesses of the mold pattern and fill the recesses from the bottom up to some predetermined level so the polymer only partially fills the mold depth after being melted to form polymer melt 59 by IR cure station 22. A soft polymer sheet 161 of polyethylene, polyester or similar resiliency then is applied to the surface of mold 30 and pressed into the mold 30 to press the soft sheet 161 uniformly to some specific level 162. The underlying polymer melt 59 is finally cured at UV or IR station 33. The soft sheet 161 then may be removed and separated from the cured film 159 having the vias formed thereon. The shape of the vias will be determined by the shape of the mold protuberances 65.

Figure 12A:
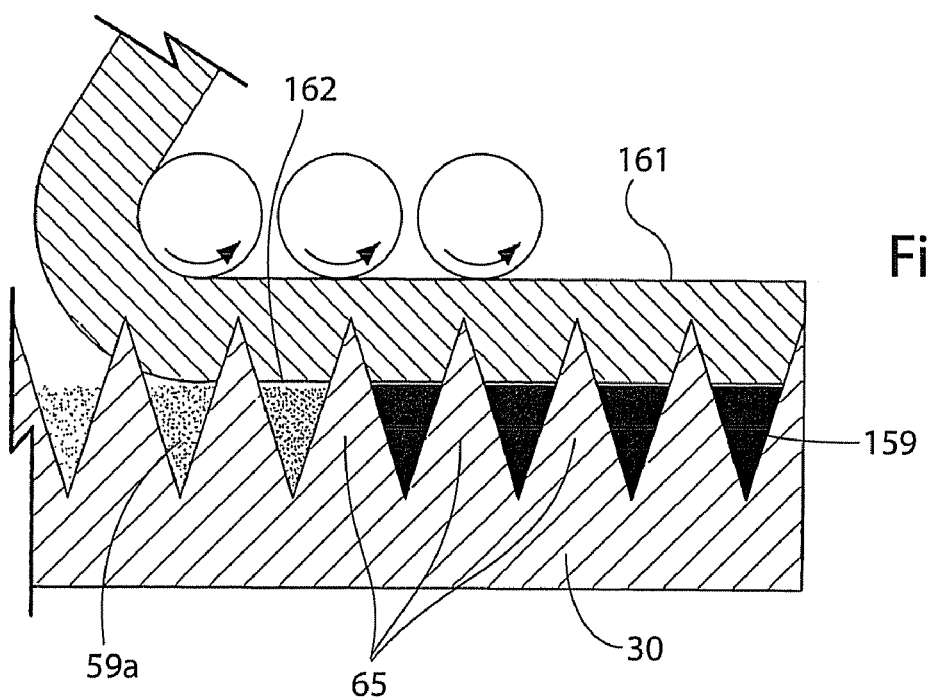
FIG. 12A is an enlarged view of the composite layers that form the precision through-holes.

FIG. 12A is a side view of FIG. 12 illustrating mold 30 being partially filled with polymer 59a and the mold protuberances penetrating the soft sheet 161.

FIG. 12B is a partial enlarged side view of FIG. 12A after cooling with the mold portion 30 having protuberances 65 being peeled away from the bottom of the cured polymer film 159 and the soft upper sheet 161 being peeled away from the top of the cured polymer film 159. The resulting polymer film layer 159 shows through holes 67 accurately formed by the protuberances 65 as a permanent feature of the replicated film 159. Each through-hole 67 is defined by a top perimeter 67a and a bottom perimeter 67b.

FIG. 12C is a bottom plan view of the film 159 having through-holes 67 made in accordance with the process and apparatus illustrated in FIGS. 12, 12A, and 12B. It maybe seen that each through-hole 67 is defined by a larger bottom perimeter 67b and a smaller top perimeter 67a.

FIG. 12D is an enlarged bottom perspective view of a through-hole 67 formed in polymer film 159, the through-hole 67 having a bottom perimeter 67b and a top perimeter 67a.

FIG. 12E is an enlarged top plan view of mold 30 having a pattern of protuberances 65 that can be used in the method and apparatus of FIGS. 12, 12A, and 12B. In the illustrated embodiment the protuberances are in the form of cube corners. In this, and in other embodiments, it will be understood that the complex-patterned mold may be used to form discrete objects on the continuous film, followed by separating the formed objects having complex patterns into discrete objects. In one embodiment, the polymer powder can be applied intermittently rather than continuously onto the moving belt to form discrete objects thereon.

Figure 13A:
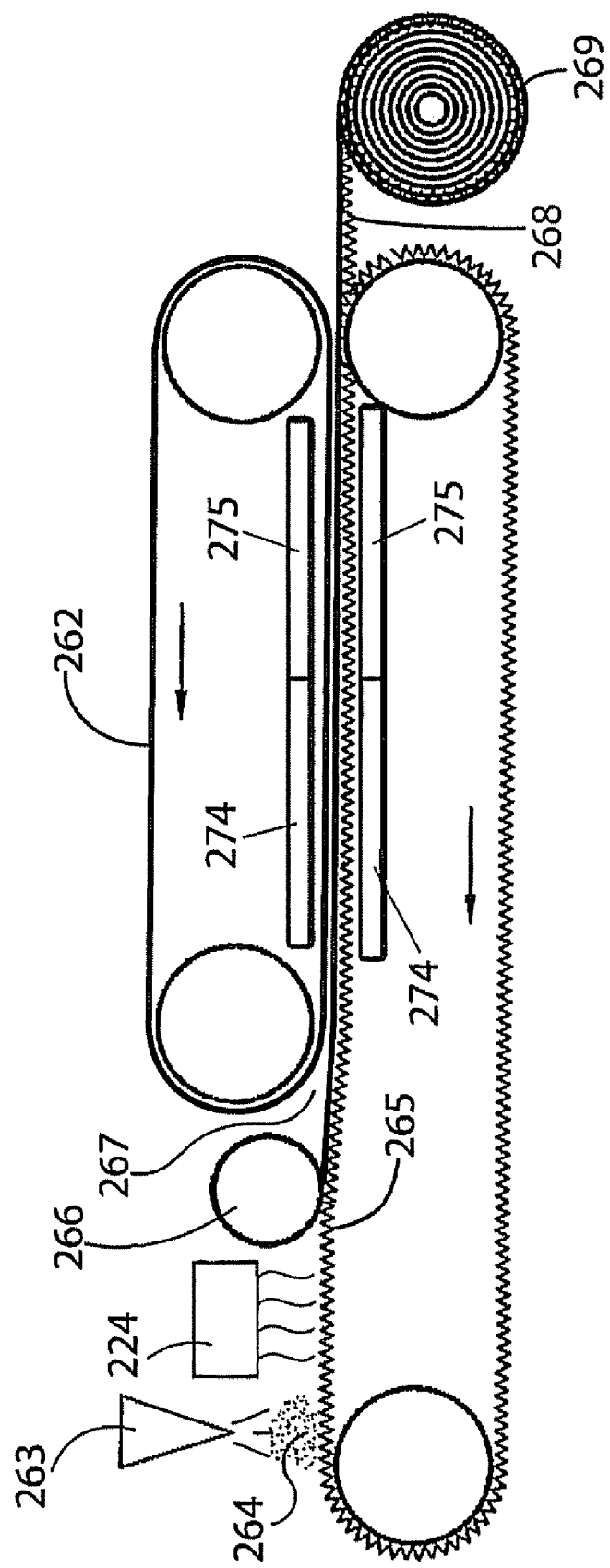
FIG. 13A illustrates an apparatus to fabricate a one-sided microstructured product.

FIG. 13A is a side view of apparatus which has demonstrated a capability to fabricate one-sided microstructured products modified in accordance with the present invention. The apparatus comprises a double-band press similar to that sold by Hymmen GmbH of Bielefeld, Germany, as models ISR and HPL, which are examples of continuous press, high-speed, high-pressure processing machinery. Powdered polymer 264 is deposited from applicator gun 263, onto belt 265 having a complex pattern thereon, heated to its molten state at a heating station 224, and then combined with a thicker backing film 266 of the same or a different polymer, the powder 264 and backing film 266 being laminated between smooth belt 262 and patterned belt 265 at juncture 267. The laminate passes heating station 274, where molten polymer powder 264 adheres to backing film 266, and then passes cooling station 275, where the laminate solidifies. The final product in this illustration is a one-sided microstructured film 268 bearing a replica of the mold pattern, that is wound into rolls 269. If the backing film 266 is of the same polymer as powder 264, then the layers can fuse together to form an integral structure.

Figure 13B:
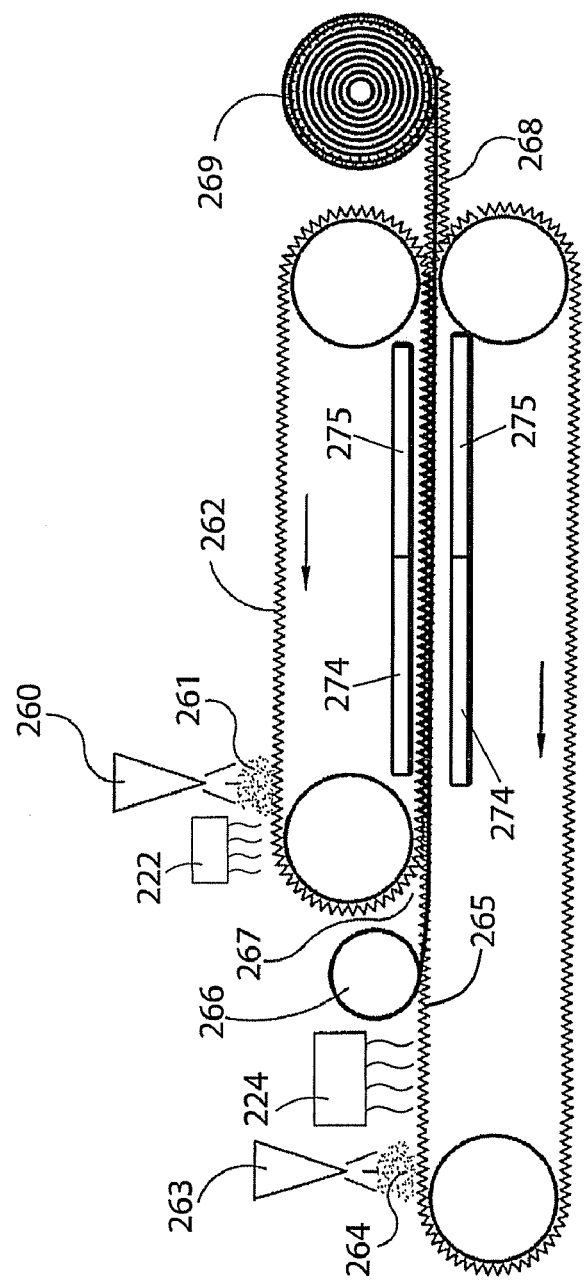
FIG. 13B illustrates an apparatus to fabricate a two-sided microstructured product.

FIG. 13B is side view of an alternative embodiment of the apparatus of FIG. 13A adapted for manufacturing two-sided micro-structured products. In this embodiment, both belts 262 and 265 are each provided with complex patterns, the belts being disposed in relation to one another so as to define opposed mold faces. Polymer powders 264 and 261 are deposited by respective application guns 263 and 260 onto respective belts 265 and 262, and heated to their molten state at respective heating stations 224 and 222. Optional backing film 266 is introduced so as to be disposed between the two polymer layers, the polymer layers and optional backing film forming a laminate at juncture 267. The two polymer powders and the backing film can all be the same material, or they can be different. The two polymers and the optional backing film pass through heating station 274, where each of the molten polymers adheres either to the backing film 266 or, in the absence of backing film 266, to the non-patterned surface of the other polymer. The laminate then passes through cooling station 275 where the laminate solidifies. The final product is a two-sided microstructured film that is wound onto rolls 269; the opposite sides of the film bearing replicas of the surfaces of the two belts, respectively.

Double band presses of this type can heat and then cool polymer substrates as thick as 0.25 inches thick (0.635 cm) at speeds as high as 30 to 60 feet per min (10-20 meters min) or more. Apparatus such as the disclosed double-band press is capable of processing temperatures as high as 662° F. (350° C.) and pressure as high as 1430 psi (100 bar). The combination of high temperature and high pressure over the entire surface of the belt makes this apparatus uniquely suited as a means to continuously fabricate microstructured and nano-structured polymer layers.

Figure 14:
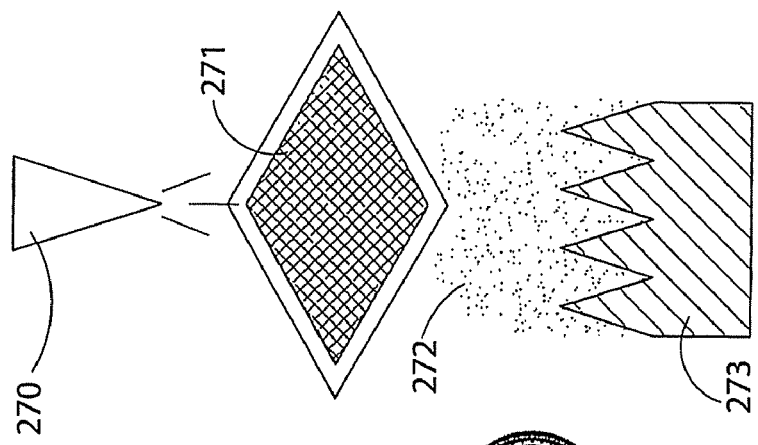
FIG. 14 illustrates an apparatus to apply additional layers of powder coating over an initial electrodeposited layer.

FIG. 14 is a side view of an apparatus comprising a positively charged screen 271, which is used to accelerate polymer powder 272 dispensed from applicator 270 to achieve high velocity impact on the surface of a substrate 273 having a pattern of microstructures formed on a surface thereof. It is known in the powder coating industry that as powder is deposited to thicknesses of 0.005 inches (125 microns) to 0.006 inches (150 microns) and more, the insulating properties of the coating will reduce the ability of the coating to be applied to greater thickness because the electrostatic charge is reduced. Once the initial 0.005 inch (125 microns) to 0.006 inch (150 microns) of polymer 272 is applied and cured, additional powder could be applied by the use of an accelerating system to build thicker layers. This technique could be particularly useful if the initial coating is warm, which helps the subsequent layers to stick to the first layer.

Figure 15:
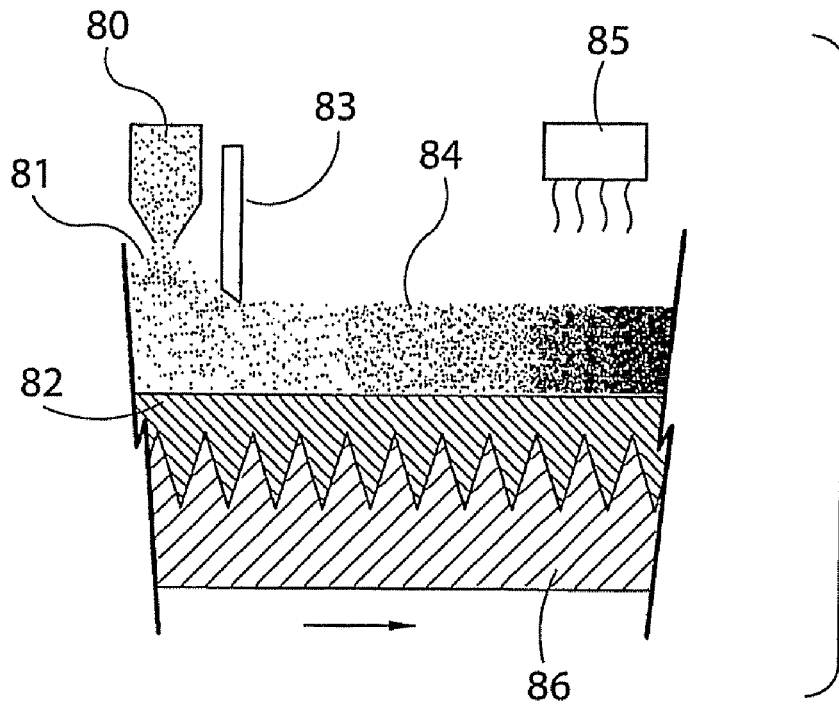
FIG. 15 illustrates an apparatus to apply thicker layers of powder coating after the initial electrodeposited layer.

FIG. 15 is a side view of a mechanical apparatus that can be used to apply thick layers over an initial electrodeposited powder layer. A gravity feed hopper or similar device 80 applies polymer powder coating 81 over the top of the first polymer powder layer 82. A metering knife 83 applies the powder at a controlled thickness 84 which is then cured by IR or UV station 85. Both layers are fused together and later removed from mold 86.

A powder coating device of this type is used to apply thick layers of polymers once the initial layer has covered the micro features and been cured. Since the first electrodeposited layer has now replicated the microstructures or nano-structures with optical precision, the balance of the coating can be applied in macro cross-sections and fused to the first layer to achieve thickness greater than would normally be done using standard powder coating techniques. By this means the process could achieve thicknesses of several millimeters if desired.

Figure 16:
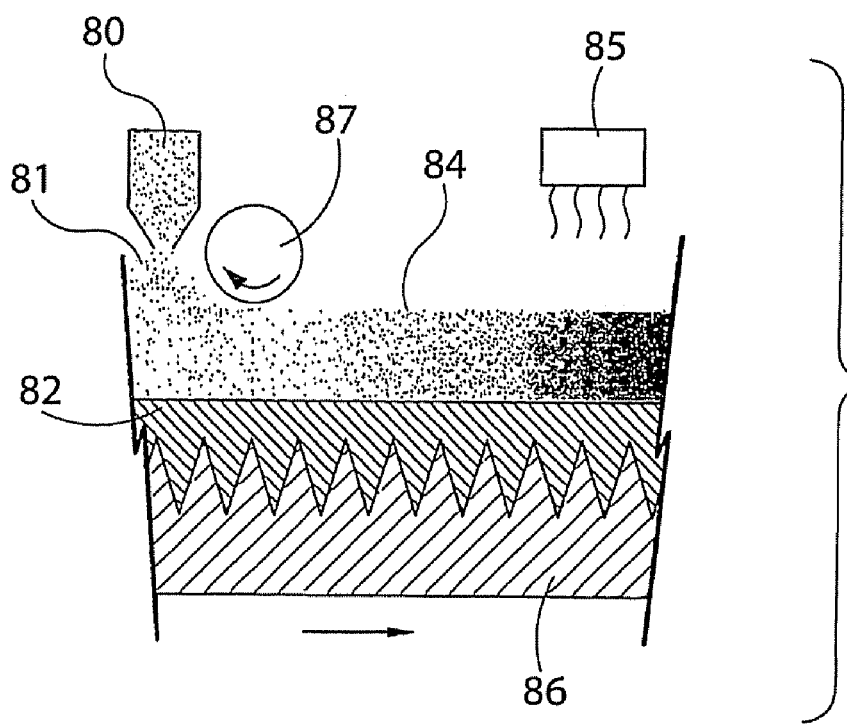
FIG. 16 illustrates another apparatus to apply thicker layers of powder coating after the initial electrodeposited layer.

FIG. 16 is a side view of an alternative mechanical apparatus also used to apply thick layers over the initial electrodeposited powder layer. In this case, the polymer powder 81 is again applied by a hopper 80 onto the top of the first polymer powder layer 82. A metering roll 87 is then used to apply a controlled thickness 84 of the powder 81 which is then cured by IR or UV station 85.

Figure 17:
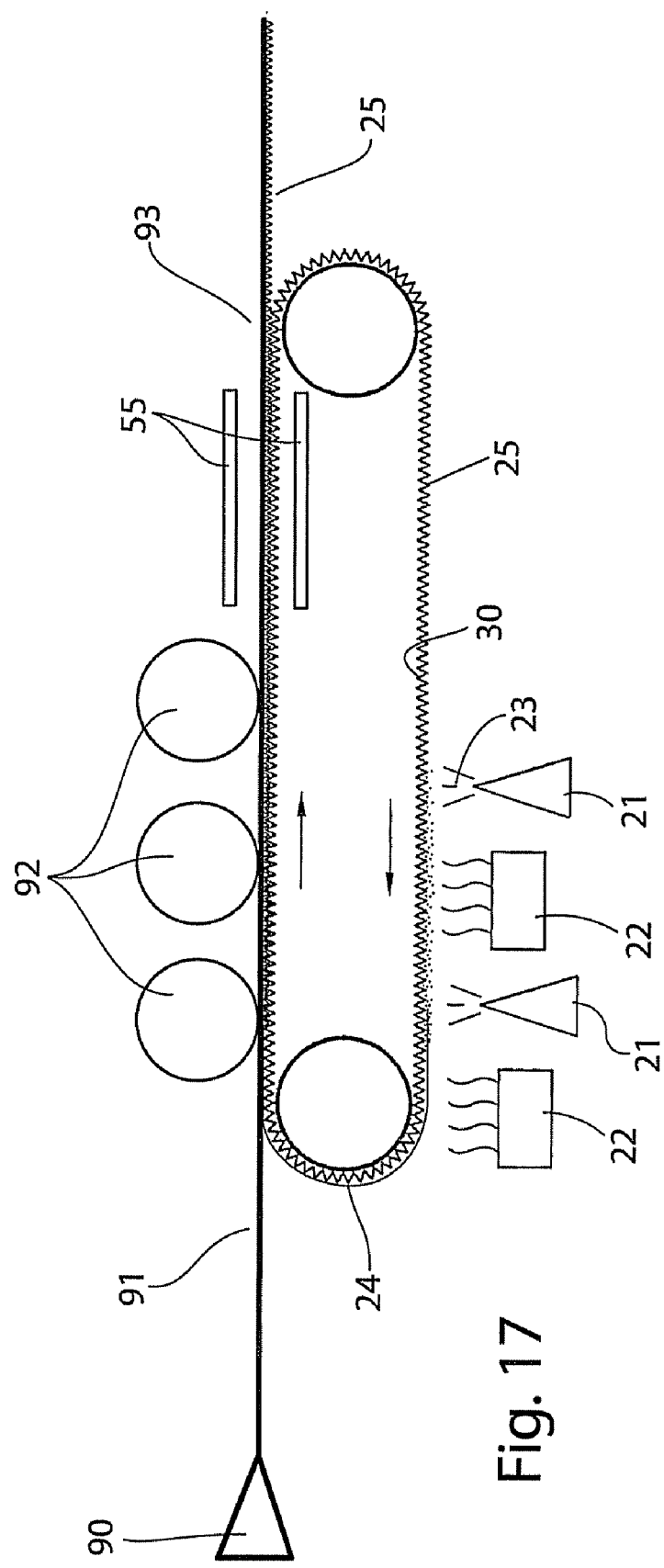
FIG. 17 illustrates an apparatus used to fabricate thick rigid micro-structured sheet in a single high-speed operation.

FIG. 17 illustrates an apparatus that can be used to make relatively thick, rigid microstructured products at high speeds. In the illustrated embodiment, an endless flexible belt 30 is provided on its outer surface with a pattern 25 of microstructures. One or more polymer applicators such as electrostatic guns 21 are used to apply a polymer powder 23 over the pattern 25. Such application can be facilitated by the use of an optional charged screen as previously discussed, omitted from FIG. 17 for the sake of clarity. The use of such an optional charged screen facilitates the application of polymer powder to the belt 30 in an upward direction, although an upwardly directed application of powder can work even in the absence of such a charged screen because the static attraction of the powder to the mold can be great enough to overcome gravity. The configuration of the applicators and the other components of the apparatus will be determined by the requirements of each particular installation. The polymer powder is melted by one or more heat sources such as IR emitters 22 to form a thin film 24 having a microstructured pattern 25 replicated thereon. A preferred polymer powder for this application is Cyro FF polymethylmethacrylate (PMMA); the typical temperature of this molten polymer at the surface of belt 30 is about 230° C. (446° F.).

Simultaneously, an extruder 90 extrudes a relatively thick polymer sheet 91, typically about 3 mm thick, and optionally rigid. Extruded polymer sheet 91 can be of the same polymer material as the polymer powder, or it can be of a different material. Thin film 24 and extruded polymer sheet 91 are laminated together while still hot at high pressure laminating rolls 92, which can be, for example, silicone covered steel rolls. The laminated product 93 is an integral sheeting structure; if the materials of the film 24 and the extruded sheet 91 are the same then the laminated product 93 also will be homogeneous. Laminated product 93 passes through cooling stations 55, where high velocity chilled air cools the product 93 to below its glass transition temperature, typically about 80° C. for PMMA, thereby locking in the microstructure pattern 25 on a surface thereof. The illustrated apparatus can produce product of width of 1 meter or even wider, while processing continuously at speeds of about 2 meters per minute. There is thus provided a novel operation for combining the manufacture of microstructured thin films and laminating such films to an extruded sheet to produce a thick, optionally rigid sheet of 3 mm or greater thickness with a precision microsturcture pattern replicated on a surface thereof. If the product is rigid it can be cut into discrete objects such as by a downstream die-cutter, not shown. If the product is flexible, it can be either die-cut into discrete objects or wound onto a roll, not shown.

While the invention has been described in conjunction with preferred embodiments, it will be obvious to one skilled in the art that other objects and refinements of the present invention may be made with the present invention within the purview and scope of the present invention.

The invention, in its various aspects and disclosed forms, is well adapted to the attainment of the stated objects and advantages and others. The disclosed details are not to be taken as limitations on the invention, except as those details may be included in the appended claims. The embodiments of the invention in which an exclusive property or privilege is claimed are as follows:

What is claimed is:

1. A method of continuously producing a polymeric object having a complex pattern formed on a surface thereof, the complex pattern comprising elements of predetermined microstructured or nano-structured dimensions, the method comprising the steps of:
   a) providing a mold that moves along a continuous path, at least a portion of which path is substantially planar, said mold having a complex pattern including recesses of microstructures or nanostructures formed on at least a portion of a surface thereof;
   b) depositing a polymeric powder comprising either a thermosetting or thermoplastic resin on said moving mold surface, the particle size of said polymer powder being sufficiently small so that said polymer powder particles fill the recesses of said complex pattern in said mold surface from the bottom up so as substantially to avoid any air entrapment;
   c) melting the powder on said moving mold surface;
   d) cooling said melted polymer at the substantially planar portion of the continuous path to create a polymeric object having a complex pattern on a surface thereof, said complex pattern on said polymeric object being complementary to the complex pattern on said mold surface; and
   e) continuously removing said polymer object having said complex pattern from said moving mold,
   wherein the mold surface provides a throughhole in the polymeric object.

2. The method of claim 1, wherein said resin comprises a thermoplastic resin selected from one or more of: acrylic, polycarbonate, polyester, urethane, nylon, polypropylene, polyethylene, polyvinylchloride and silicones.

3. The method of claim 1, wherein said resin comprises a thermosetting resin selected from one or more of: functional epoxy, epoxy-polyester, silicone and UV curable polymer.

4. The method of claim 1, wherein said polymeric powder is substantially free of additives.

5. The method of claim 1, wherein the polymeric powder further comprises a further phase or filler material.

6. The method of claim 1, wherein the step of providing said mold having a complex pattern on a surface thereof comprises first forming the mold of a polymeric material by depositing a polymer powder against a substrate having the desired complex pattern formed therein.

7. The method of claim 1, wherein said particles have a maximum dimension no greater than about 50 microns.

8. The method of claim 7, wherein said particles have a maximum dimension in the range of about 5-20 microns.

9. The method of claim 1, wherein throughholes are formed in said object by partially filling the depth of the complex pattern on the mold with the polymeric powder, said method including the further steps of pressing a resilient layer of material over the deposited powder to press the polymeric powder to a substantially uniform level, and then curing the polymeric powder to form said object.

10. The method of claim 1, wherein the thickness of said object is between about 0.001 inch (25 microns) and about 0.020 inch (500 microns).

11. The method of claim 1, wherein said mold moves at a speed of between about 50 and 100 ft./min.

12. The method of claim 1, comprising forming a plurality of objects produced as part of a single layer film, and separating said objects into discrete components.

* * * * *